United States Patent
Shirai (10) Patent No.: US 10,519,565 B2
(45) Date of Patent: Dec. 31, 2019

(54) SIC SINGLE CRYSTAL AND METHOD FOR PRODUCING SAME

(71) Applicant: TOYOTA JIDOSHA KABUSHIKI KAISHA, Toyota-shi, Aichi-ken (JP)

(72) Inventor: Takayuki Shirai, Susono (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 15/592,500

(22) Filed: May 11, 2017

(65) Prior Publication Data
US 2017/0327967 A1    Nov. 16, 2017

(30) Foreign Application Priority Data
May 12, 2016    (JP) .................. 2016-096098

(51) Int. Cl.
*C30B 19/06* (2006.01)
*C30B 29/36* (2006.01)

(52) U.S. Cl.
CPC ............ *C30B 19/062* (2013.01); *C30B 29/36* (2013.01)

(58) Field of Classification Search
None
See application file for complete search history.

(56) References Cited

U.S. PATENT DOCUMENTS

| | | |
|---|---|---|
| 3,025,192 A | 3/1962 | Lowe |
| 2009/0194017 A1 | 8/2009 | Terashima et al. |
| 2010/0289033 A1 | 11/2010 | Ohtani et al. |
| 2016/0068993 A1* | 3/2016 | Shirai ............. C30B 9/06 257/77 |
| 2017/0283982 A1 | 10/2017 | Kusunoki et al. |

FOREIGN PATENT DOCUMENTS

| | | |
|---|---|---|
| CN | 101896647 A | 11/2010 |
| EP | 2 230 332 A1 | 9/2010 |
| JP | 2005-314217 A | 11/2005 |
| JP | 2009-184879 A | 8/2009 |
| JP | 2016-056079 A | 4/2016 |
| JP | 2017-065955 A | 4/2017 |
| JP | 2017-065986 A | 4/2017 |
| WO | 2009/095764 A1 | 8/2009 |
| WO | 2014/136903 A1 | 9/2014 |
| WO | 2016/038845 A1 | 3/2016 |

OTHER PUBLICATIONS

Fujimoto et al.; JP2011225392; Google translation provided; Sep. 2018.*
Sutton et al.; Solution Growin SiC p-n junctions; Brit. J. Appl. Phys; Ser2, vol. 2; 1969.*

* cited by examiner

*Primary Examiner* — Guinever S Gregorio
(74) *Attorney, Agent, or Firm* — Oliff PLC (57) ABSTRACT

A low-resistance p-type SiC single crystal containing no inclusions is provided. A method for producing a SiC single crystal in which a SiC seed crystal substrate is contacted with a Si—C solution having a temperature gradient such that a temperature of the Si—C solution decreases from an interior of the Si—C solution toward a surface of the Si—C solution, to grow the SiC single crystal, wherein the Si—C solution comprises Si, Cr, Al and B, and wherein the Al is comprised in the Si—C solution in an amount of 10 at % or greater, based on the total of the Si, Cr, Al and B, and the B is comprised in the Si—C solution in an amount of greater than 0.00 at % and no greater than 1.00 at %, based on the total of the Si, Cr, Al and B.

7 Claims, 4 Drawing Sheets

SIC SINGLE CRYSTAL AND METHOD FOR PRODUCING SAME

TECHNICAL FIELD

The present invention relates to a SiC single crystal that is suitable as a semiconductor element, and to a method for producing the same.

BACKGROUND ART

SiC single crystals are thermally and chemically very stable, superior in mechanical strength, and resistant to radiation, and also have superior physical properties, such as high breakdown voltage and high thermal conductivity compared to Si single crystals. They are therefore able to exhibit high output and high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy saving to be achieved, device materials for high-speed large volume information communication, high-temperature device materials for vehicles, radiation-resistant device materials, and the like. In particular, there is a demand for p-type SiC single crystals with low resistivity, in order to obtain ultra-high voltage-resistant elements that are considered promising for applications in electrical power systems and the like.

Typical growth processes for growing SiC single crystals that are known in the prior art include gas phase processes, the Acheson process and solution processes. Gas phase processes, such as sublimation processes, have a drawback in that grown single crystals have been prone to hollow penetrating defects known as micropipe defects, lattice defects, such as stacking faults, and generation of polymorphic crystals. However, in the prior art, most SiC bulk single crystals are produced by sublimation processes, while attempts are being made to reduce defects in the grown crystals. In the Acheson process, heating is carried out in an electric furnace using silica stone and coke as starting materials, and therefore it has not been possible to obtain single crystals with high crystallinity due to impurities in the starting materials.

Solution processes are processes in which molten Si or molten Si in which a metal other than Si is melted is formed in a graphite crucible, C is dissolved into the molten liquid, and a SiC crystal layer is deposited and grown on a seed crystal substrate set in the low temperature zone. Solution processes can be expected to reduce defects because crystal growth is carried out in a state of near thermal equilibrium, compared to gas phase processes.

For this reason, a variety of different measures have been taken to produce low-resistance p-type SiC single crystals using solution processes, in order to obtain ultra-high voltage-resistant elements that are considered promising for applications in electrical power systems and the like. In PTL 1 there is proposed a method for producing a p-type SiC single crystal wherein Al is added to a Si—C solution.

CITATION LIST

Patent Literature

[PTL 1] Japanese Unexamined Patent Publication No. 2009-184879

SUMMARY OF THE INVENTION

Problems to be Solved by the Invention

However, it has still not been possible to achieve sufficiently low resistance when p-type SiC single crystals are produced using the prior art by solution processes, such as the one described in PTL 1. A p-type SiC single crystal with even lower resistivity has therefore been desired.

Means for Solving the Problems

The present inventors have conducted ardent research on further lowering resistance of p-type SiC single crystals, and have found that a p-type SiC single crystal with lower resistance than the prior art can be obtained by using a Si—C solution with Al added and B added to it.

The present disclosure is a method for producing a SiC single crystal in which a SiC seed crystal substrate is contacted with a Si—C solution having a temperature gradient such that a temperature of the Si—C solution decreases from an interior of the Si—C solution toward a surface of the Si—C solution, to grow the SiC single crystal, wherein the Si—C solution comprises Si, Cr, Al and B, and wherein the Al is comprised in the Si—C solution in an amount of 10 at % or greater, based on the total of the Si, Cr, Al and B, and the B is comprised in the Si—C solution in an amount of greater than 0.00 at % and no greater than 1.00 at %, based on the total of the Si, Cr, Al and B.

The present disclosure is also a p-type SiC single crystal having resistivity of 9 to 29 mΩ·cm, and having a growth thickness of 1 mm or greater.

Effect of the Invention

According to the present disclosure it is possible to obtain a p-type SiC single crystal having lower resistivity than the prior art.

DESCRIPTION OF EMBODIMENTS

Throughout the present specification, the indication "−1" in an expression, such as "(000−1) face", is used where normally a transverse line is placed over the numeral.

The present disclosure is a method for producing a SiC single crystal in which a SiC seed crystal substrate is contacted with a Si—C solution having a temperature gradient such that a temperature of the Si—C solution decreases from an interior of the Si—C solution toward a surface of the Si—C solution, to grow the SiC single crystal, wherein the Si—C solution comprises Si, Cr, Al and B, and wherein the Al is comprised in the Si—C solution in an amount of 10 at % or greater, based on the total of the Si, Cr, Al and B, and the B is comprised in the Si—C solution in an amount of greater than 0.00 at % and no greater than 1.00 at %, based on the total of the Si, Cr, Al and B.

A solution process is used in the method of the present disclosure. A solution process is a method for producing a SiC single crystal in which a SiC seed crystal substrate is contacted with a Si—C solution having a temperature gradient such that a temperature of the Si—C solution decreases from an interior of the Si—C solution toward a surface of the Si—C solution, to grow the SiC single crystal. By forming a temperature gradient in which the temperature decreases from the interior of the Si—C solution toward the surface of the solution (liquid surface), the surface region of the Si—C solution becomes supersaturated and a SiC single crystal is grown from the seed crystal substrate contacting with the Si—C solution.

In the prior art, it has been difficult to adequately achieve lower resistance of a p-type SiC single crystal even when the p-type SiC single crystal is grown by using a Si—C solution containing Al. While it is not our intention to be constrained by theory, it is believed that because Al has a larger atomic radius than Si, the lattice constant of a SiC crystal is increased when Al is in solid solution in the SiC crystal, and the SiC single crystal is therefore energetically unstable, such that fewer Si sites can be replaced by Al, and the resistance of the p-type SiC single crystal cannot be sufficiently lowered.

In contrast, it has been found that adding B to the Si—C solution in addition to Al can achieve adequately lower resistance for a p-type SiC single crystal. Because B has a smaller atomic radius than Si, having B in solid solution in a SiC crystal results in a smaller lattice constant of the crystal. Therefore, adding B and Al to the Si—C solution presumably allows a greater number of Si sites to be replaced by Al, allowing the resistance of the p-type SiC single crystal to be lowered by that amount. A p-type SiC single crystal obtained by the method of the present disclosure can have extremely low resistivity of about 1/200 of the resistivity of a conventional p-type SiC single crystal.

In addition to the effect of reducing the lattice constant, addition of B to the Si—C solution can produce a notable effect of lowering the resistivity that cannot be obtained with addition of other elements, since the addition of B is not a factor in increased resistivity, does not involve problems of safety, and has good dissolving properties in solvents.

For the method of the present disclosure, "Si—C solution" refers to a C-dissolved solution, of which the solvent is a molten liquid containing Si, Cr, Al and B.

The Al content of the Si—C solution is 10 at % or greater, preferably 15 at % or greater, more preferably 20 at % or greater, even more preferably 25 at % or greater and still more preferably 30 at % or greater, based on the total of Si, Cr, Al and B. The upper limit for the Al content in the Si—C solution is not particularly restricted from the viewpoint of achieving low resistivity for the p-type SiC single crystal, but from the viewpoint of obtaining stable crystal growth of the p-type SiC single crystal, it is preferably no greater than 33 at % and more preferably no greater than 30 at %, based on the total of Si, Cr, Al and B.

If B is present even in a small amount in the Si—C solution, it will be possible to increase the Al concentration in the grown SiC single crystal compared to the prior art, and in particular to increase the Al concentration in the grown SiC single crystal, compared to the prior art, even when the Al content is 10 at % or greater in the Si—C solution, allowing a p-type SiC single crystal with lower resistivity than the prior art to be obtained. The content of B in the Si—C solution is therefore greater than 0.00 at %, preferably 0.01 at % or greater, more preferably 0.02 at % or greater, even, more preferably 0.03 at % or greater and yet more preferably 0.10 at % or greater, based on the total of Si, Cr, Al and B. The upper limit for the B content of the Si—C solution is no greater than 1.00 at %, preferably no greater than 0.30 at % and more preferably no greater than 0.10 at %.

If the Si—C solution contains Al and B in amounts within the above ranges, it will be possible to grow a p-type SiC single crystal having low resistivity.

The Si content of the Si—C solution is preferably 30 to 77 at % based on the total of Si, Cr, Al and B.

The Cr content of the Si—C solution is preferably 20 to 60 at % based on the total of Si, Cr, Al and B.

If the Si and Cr contents of the Si—C solution are within the above ranges, it will be possible to more stably grow a p-type SiC crystal with low resistivity.

The Si—C solution may also contain other metals in addition to Si, Cr, Al and B. Such other metals are not particularly restricted so long as they can form a liquid phase (solution) in thermodynamic equilibrium with the SiC (solid phase), and they may include Ti, Mn, Ni, Ce, Co, V and Fe, for example.

The Si—C solution is preferably a Si—C solution wherein the solvent is a molten liquid consisting of Si, Cr, Al and B. The amounts of Si, Cr, Al and B in the Si—C solution are preferably, respectively, 30.00 at % or greater and less than 77.00 at %, 13.00 at % or greater and less than 60.00 at %, 10.00 at % or greater and less than 33.00 at %, and greater than 0.00 at % and no greater than 1.00 at %, and more preferably between 41.40 at % and 53.98 at %, inclusive, between 27.60 at % and 35.99 at %, inclusive, between 10.00 at % and 30.00 at %, inclusive and between 0.03 at % and 1.00 at %, inclusive, based on the total of Si, Cr, Al and B. A Si—C solution wherein the solvent is a molten liquid containing Si, Cr, Al and B in amounts within the above ranges is more preferred since fluctuation in the amount of dissolved C will be minimal.

The temperature gradient in the surface region of the Si—C solution is the temperature gradient in the direction perpendicular to the liquid surface of the Si—C solution, which is a temperature gradient where the temperature falls from the interior of the Si—C solution toward the surface (liquid surface) of the solution. The temperature gradient can be calculated as the average value obtained by pre-measuring the temperature A on the surface (liquid surface) of the Si—C solution which is the low-temperature side, and the temperature B which is the high-temperature side at a prescribed depth from the surface of the Si—C solution in the direction perpendicular to the surface of the Si—C solution, using a thermocouple before contacting the seed crystal substrate with the Si—C solution, and dividing the temperature difference by the distance between the positions at which temperature A and temperature B were measured. For example, when measuring the temperature gradient between the surface of the Si—C solution and the position at depth D cm from the surface of the Si—C solution in the direction perpendicular to the surface of the Si—C solution, calculation can be performed by the following formula:

Temperature gradient (° C./cm)=$(B-A)/D$ which is the difference between the surface temperature A of the Si—C solution and the temperature B at a position at depth D cm from the surface of the Si—C solution in the direction perpendicular to the surface of the Si—C solution, divided by D cm.

The range in which the temperature gradient is controlled is preferably to a depth of 1 cm and more preferably 3 cm from the surface of the Si—C solution. When the temperature gradient is to be controlled up to a depth of 3 cm from the surface of the Si—C solution, the temperature gradient (° C./cm) in the formula is the value obtained when the difference between the surface temperature A of the Si—C solution and the temperature B at a position at a depth of 3 cm from the surface of the Si—C solution in the direction perpendicular to surface of the Si—C solution, is divided by 3 cm.

When the range of control of the temperature gradient is too shallow, the range in which the degree of supersaturation of C is controlled will also be shallow, often causing growth of the SiC single crystal to be unstable. If the range of control of the temperature gradient is too deep, the range in which the degree of supersaturation of C is controlled will also be deep, which is effective for stable growth of the SiC single crystal, but in actuality the depth contributing to single crystal growth is very close to the surface of the Si—C solution and therefore it is sufficient to control the temperature gradient up to a depth of several mm from the surface. Consequently, in order to conduct stable SiC single crystal growth and temperature gradient control, it is preferred to control the temperature gradient within the depth range specified above.

According to the method of the present disclosure, it is possible to obtain a p-type SiC single crystal having an Al concentration of preferably $2.3 \times 10^{20}/cm^3$ or greater, more preferably $2.5 \times 10^{20}/cm^3$ or greater, even more preferably $3.1 \times 10^{20}/cm^3$ or greater, yet more preferably $4.1 \times 10^{20}/cm^3$ or greater, even yet more preferably $4.3 \times 10^{20}/cm^3$ or greater, and even yet more preferably $7.1 \times 10^{20}/cm^3$ or greater. The upper limit for the Al concentration in the p-type SiC single crystal is about $7.1 \times 10^{20}/cm^3$. By doping a p-type SiC single crystal with an Al concentration in the above range, it is possible to obtain a p-type SiC single crystal having low resistivity.

The Al concentration in the SiC single crystal can be measured by using secondary ion mass spectrometry (SIMS).

The method of the present disclosure allows growth of a low-resistance p-type SiC single crystal having resistivity of preferably 29 mΩ·cm or lower, more preferably 16 mΩ·cm or lower, even more preferably 15 mΩ·cm or lower, yet more preferably 13 mΩ·cm or lower, even yet more preferably 12 mΩ·cm or lower, and even yet more preferably 9 mΩ·cm or lower. The p-type SiC single crystal obtained by the method of the present disclosure generally tends to exhibit lower resistance with a greater Al concentration in the crystal.

In the method of the present disclosure, a p-type SiC single crystal with low resistivity can be obtained even when growth is conducted on the (000-1) face (C-surface). Since (000-1) face (C-surface) growth can be conducted, it is possible to grow a low-resistance p-type SiC single crystal with a large thickness. It is possible to grow a low-resistance p-type SiC single crystal having a growth thickness of preferably 1.0 mm or greater, more preferably 2.0 mm or greater, even more preferably 2.7 mm or greater, yet more preferably 3.0 mm or greater, even yet more preferably 4.0 mm or greater and still yet more preferably 4.5 mm or greater. For example, a low-resistance p-type SiC single crystal can be grown to a thickness of 2.7 to 4.5 mm. The upper limit for the growth thickness is not particularly restricted, but may be up to 10 mm, for example.

In the course of this research, the present inventors found that if Al is simply added to the Si—C solution and (000-1) face growth is conducted, the Al doping amount in the SiC grown crystal is limited to about $1.8 \times 10^{20}/cm^3$, but that the Al doping amount in the grown crystal can be increased if (0001) face growth is conducted. While it is not our intention to be constrained by theory, it is believed that the upper limit of the Al doping amount in the grown crystal changes depending on the growth surface because the number of Al-substituted sites differs depending on the growth surface. In addition, whereas a low upper limit for the Al doping amount in (000-1) face growth was a problem as described above, it has been demonstrated that the method of the present disclosure allows a large amount of Al to be present in solid solution even with (000-1) face growth. When (0001) face growth is conducted, the growth thickness can substantially only be increased to about 500 μm, but the method of the present disclosure has no restrictions on the growth surface and can increase the Al doping amount on either the (000-1) face or the (0001) face as the growth surface, thereby allowing (000-1) face growth to be accomplished, to obtain a p-type SiC single crystal with low resistivity that has a large growth thickness in the above range.

The diameter of the grown crystal is not particularly restricted, and it may be 10 to 50 mm or 15 to 30 mm, for example.

In the method of the present disclosure, the temperature gradient in the surface region of the Si—C solution is preferably in a range such that the temperature gradient y (° C./cm) satisfies inequality (1):

$$y \geq 0.15789x + 21.52632 \qquad (1)$$

(wherein x represents the Al content (at %) of the Si—C solution).

When growth of a SiC single crystal is conducted using a Si—C solution with a large amount of Al added based on the total amount of solvent, inclusions are often generated in the grown crystal. However, if the speed of crystallization of the grown crystal is increased as the amount of Al addition increases, it is possible to grow a low-resistance p-type SiC single crystal without generating inclusions.

The term "inclusions" refers to components incorporated into the grown crystal from the Si—C solution (metal solvent) used for SiC single crystal growth.

While it is not our intention to be constrained by theory, it is believed that when a SiC single crystal is grown using a Si—C solution with a high Al content and a low temperature gradient, the Al-containing solvent metal is resistant to crystallization and becomes incorporated into the grown crystal as an inclusion, but that when a SiC single crystal is grown using a Si—C solution with a high Al content and a high temperature gradient, the Al-containing solvent metal is more readily crystallized and a high-quality single crystal containing no inclusions can be obtained.

The temperature gradient in the surface region of the Si—C solution is preferably 25° C./cm or greater with an Al content of the Si—C solution in the range of 10 to 20 (at %), and more preferably it is 28° C./cm or greater with an Al content of the Si—C solution in the range of 10 to 33 (at %). The upper limit for the temperature gradient is preferably 55° C./cm, more preferably 50° C./cm and even more preferably 42° C./cm. The temperature gradient may be, for example, 25 to 55° C./cm, 28 to 55° C./cm or 30 to 42° C./cm.

Figure 1A:
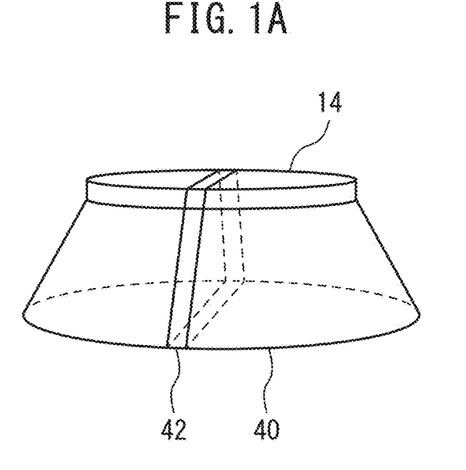
FIG. 1A and FIG. 1B are schematic diagrams showing the locations where a grown crystal is cut when examining the presence of inclusions in the grown crystal.
Figure 1B:
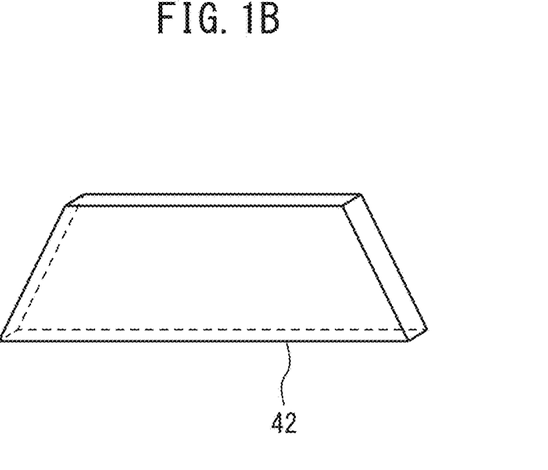

Determination of the presence or absence of inclusions in the SiC crystal can be made based on observation using an optical microscope. For example, as shown in FIG. 1A and FIG. 1B, the grown crystal 40 may be sliced parallel to the growth direction to cut out a grown crystal 42 with a thickness of about 1 mm, and then light may be directed from below of the cut grown crystal to observe whether or not the entire area of the grown crystal 42 is a continuous crystal based on a transmission image, to conduct examination of the presence or absence of inclusions.

When the grown crystal 40 is grown in a substantially concentrical manner, it may be further cut in half at the center section of the cut out grown crystal 42, and the presence or absence of inclusions in the half-cut grown crystal 42 may be examined by the same method. Since inclusions are generated more easily at the outer peripheral section, the outer peripheral section alone may be cut and the presence or absence of inclusions at the outer peripheral section may be examined. The grown crystal may also be sliced perpendicular to the growth direction, and the presence or absence of inclusions in the cut out grown crystal may be examined by the same method. Alternatively, the grown crystal may be cut out as described above and subjected to energy dispersive X-ray spectroscopy (EDX) or wavelength dispersive X-ray analysis (WDX) for qualitative analysis or quantitative analysis of the Si—C solution component in the cut out grown crystal, to detect inclusions.

The seed crystal substrate to be used in the method of the present disclosure may be a SiC single crystal having quality commonly used for production of SiC single crystals. For example, a SiC single crystal commonly formed by a sublimation process may be used as the seed crystal substrate, and the seed crystal substrate may have any desired shape, such as plate-like, discoid, cylindrical, columnar, truncated circular conic or truncated pyramidal.

Placement of the seed crystal substrate in the single crystal production apparatus may be done by holding the top face of the seed crystal substrate on the seed crystal holding shaft. A carbon adhesive may be used for holding the seed crystal substrate on the seed crystal holding shaft. The seed crystal holding shaft may be a graphite shaft, for example.

Contact of the seed crystal substrate with the Si—C solution may be conducted by lowering the seed crystal holding shaft that holds the seed crystal substrate toward the Si—C solution surface, and contacting the seed crystal substrate with the Si—C solution while the bottom face of the seed crystal substrate is parallel to the Si—C solution surface. The seed crystal substrate may then be held at a prescribed position relative to the Si—C solution surface for growth of the SiC single crystal.

Figure 2:
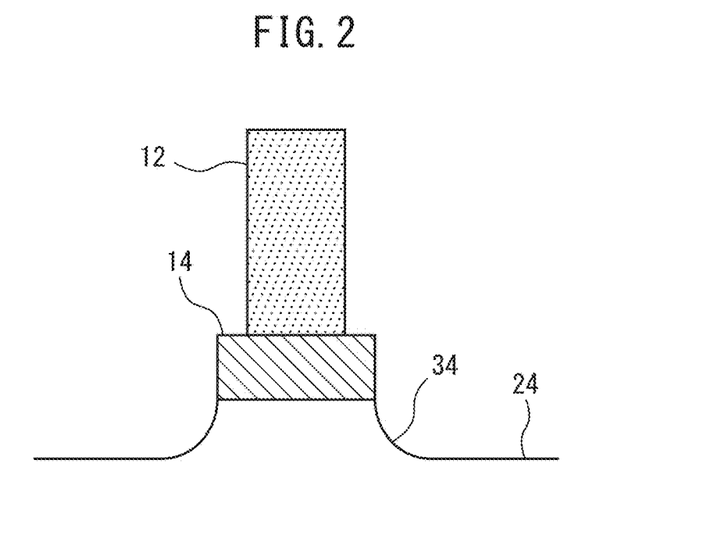
FIG. 2 is a cross-sectional schematic drawing of the meniscus formed between a seed crystal substrate and a Si—C solution.

The holding position for the seed crystal substrate may be such that the position of the bottom face of the seed crystal substrate may match the Si—C solution surface, be below the Si—C solution surface, or be above the Si—C solution surface. The position of the bottom face of the seed crystal substrate is preferably above the Si—C solution surface, as shown in FIG. 2, so that the Si—C solution 24 wets only the bottom face of the seed crystal substrate 14, forming a meniscus 34. When a meniscus is formed, the position of the bottom face of the seed crystal substrate is preferably held at a position 1 to 3 mm above the Si—C solution surface.

When the seed crystal substrate is held so that the bottom face of the seed crystal substrate is at a position above the Si—C solution surface, the seed crystal substrate is contacted once with the Si—C solution so that the Si—C solution contacts with the bottom face of the seed crystal substrate, and the seed crystal substrate is then raised to the prescribed position.

The position of the bottom face of the seed crystal substrate may match the Si—C solution surface or be lower than the Si—C solution surface. However, in order to prevent generation of polycrystals, it is preferably such that the Si—C solution does not contact with the seed crystal holding shaft. In such methods, the position of the seed crystal substrate may be adjusted during growth of the single crystal.

In the method of the present disclosure, the lower limit for the surface temperature of the Si—C solution is preferably 1800° C. or higher and the upper limit is preferably 2200° C., since the dissolution of C in the Si—C solution can be increased within the above temperature range.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

Figure 3:
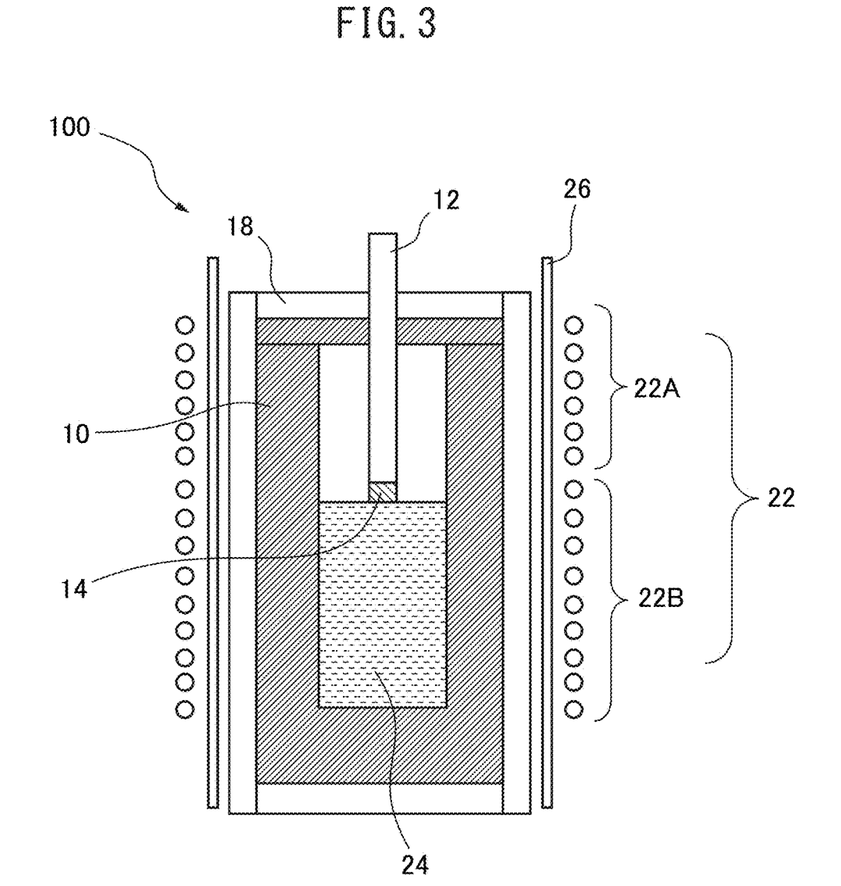
FIG. 3 is a cross-sectional schematic drawing of an example of a single crystal production apparatus based on a solution process, to be used for the method of the present disclosure.

FIG. 3 shows an example of a SiC single crystal production apparatus for carrying out the invention. The illustrated SiC single crystal production apparatus 100 comprises a crucible 10, wherein the crucible 10 receives a Si—C solution 24 having C dissolved in a molten liquid containing Si, Cr, Al and B, a temperature gradient is formed in which the temperature is decreased from the interior of the Si—C solution toward the surface of the solution, and the seed crystal substrate 14 that is held at the tip of the vertically movable seed crystal holding shaft 12 is contacted with the Si—C solution 24 to allow growth of the SiC single crystal from the seed crystal substrate 14.

The Si—C solution 24 is prepared by loading the starting materials into the crucible, melting them by heating to prepare molten liquid containing Si, Cr, Al and B, and dissolving C therein. If the crucible 10 is a carbonaceous crucible, such as a graphite crucible, or SiC crucible, C will dissolve into the molten liquid by dissolution of the crucible 10, thereby allowing a Si—C solution to be formed. This will avoid the presence of undissolved C in the Si—C solution 24, and prevent waste of SiC due to deposition of the SiC single crystal onto the undissolved C. The supply of C may be carried out by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are accommodated together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B are independently controllable.

Since the temperatures of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus.

The temperature of the Si—C solution will usually have a temperature distribution with a lower temperature at the surface than the interior of the Si—C solution due to radiation and the like. Further, by adjusting the number of turns and spacing of the high-frequency coil 22, the positional relationship of the high-frequency coil 22 and the crucible 10 in the height direction, and the output of the high-frequency coil, it is possible to form a temperature gradient in the Si—C solution 24 in the direction perpendicular to the surface of the Si—C solution 14 so that the upper portion of the solution contacting the seed crystal substrate 24 is at low temperature and the lower portion (interior) of the solution is at high temperature. For example, the output of the upper level coil 22A may be smaller than the output of the lower level coil 22B, to form a temperature gradient in the Si—C solution 24 in which the upper portion of the solution is at low temperature and lower portion of the solution is at high temperature.

The C that has dissolved in the Si—C solution 24 is dispersed by diffusion and convection. In the region near the bottom face of the seed crystal substrate 14, a temperature gradient is formed so that it is at lower temperature than the interior of the Si—C solution 24, due to control of output from the heating apparatus, heat radiation from the surface of the Si—C solution 24 and heat loss through the seed crystal holding shaft 12. When the C that has dissolved into the solution interior that is at high temperature and has high solubility reaches the region near the seed crystal substrate that is at low temperature and has low solubility, a supersaturated state appears and a SiC crystal is grown on the seed crystal substrate 14 by virtue of supersaturation as a driving force.

In an embodiment, meltback may be carried out in which the surface layer of the seed crystal substrate is dissolved in the Si—C solution and removed prior to growth of a SiC single crystal. Since the surface layer of the seed crystal substrate on which the SiC single crystal is grown may have an affected layer, such as a dislocation, a natural oxide film, or the like, removal of these by dissolution prior to growth of a SiC single crystal is effective for growing a high-quality SiC single crystal. Although the thickness of a layer to be dissolved depends on the processed conditions of the surface of the seed crystal substrate, it is preferably about 5 to 50 μm for sufficient removal of an affected layer and a natural oxide film.

The meltback may be carried out by forming in the Si—C solution a temperature gradient such that the temperature increases from the interior of the Si—C solution toward the surface of the solution, i.e. by forming a temperature gradient in a direction opposite to the case of the SiC single crystal growth. The temperature gradient in the opposite direction can be formed by controlling the output of the high-frequency coil.

In an embodiment, the seed crystal substrate may be preheated in advance, and then the same is contacted with the Si—C solution. If the seed crystal substrate at low temperature is contacted with the Si—C solution at high temperature, heat shock dislocation may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the seed crystal holding shaft. In this case, heating of the seed crystal holding shaft is stopped after contact of the seed crystal substrate with the Si—C solution and before growth of the SiC single crystal. Alternatively, the Si—C solution may be heated to the temperature for crystal growth after contacting the seed crystal with the Si—C solution at a relatively low temperature. This is also effective for preventing heat shock dislocation and growing a high-quality SiC single crystal.

The present disclosure is also a p-type SiC single crystal having resistivity of 9 to 29 mΩ·cm, and having a growth thickness of 1 mm or greater.

The p-type SiC single crystal of the present disclosure has an Al concentration of preferably $2.3 \times 10^{20}/cm^3$ or greater, more preferably $2.5 \times 10^{20}/cm^3$ or greater, even more preferably $3.1 \times 10^{20}/cm^3$ or greater, yet more preferably $4.1 \times 10^{20}/cm^3$ or greater, and even yet more preferably $4.3 \times 10^{20}/cm^3$ or greater. The upper limit for the Al concentration in the p-type SiC single crystal is about $7.1 \times 10^{20}/cm^3$.

The p-type SiC single crystal of the present disclosure is a low-resistance p-type SiC single crystal having resistivity of up to 29 mΩ·cm, preferably up to 16 mΩ·cm, more preferably up to 15 mΩ·cm, even more preferably up to 13 mΩ·cm, yet more preferably up to 12 mΩ·cm and even yet more preferably up to 9 mΩ·cm. The lower limit for the resistivity of the p-type SiC single crystal of the present disclosure is determined by the upper limit of the Al solid solution concentration in the SiC grown crystal, and it is approximately 9 mΩ·cm or greater.

The p-type SiC single crystal of the present disclosure can be obtained by the method for producing a p-type SiC single crystal described above. The method for measuring the Al concentration in a SiC grown crystal, the method for measuring the resistivity of a SiC grown crystal and the method for determining the presence or absence of inclusions, as described for the method of the present disclosure, are applied in the same manner for the p-type SiC single crystal of the present disclosure.

EXAMPLES

Example 1

There was prepared an n-type SiC single crystal formed by a sublimation process, which was a discoid 4H—SiC single crystal with a diameter of 15 mm, a thickness of 700 μm, and the bottom face as the (000-1) face, for use as a seed crystal substrate. The seed crystal substrate had resistivity of 20 mΩ·cm. A graphite shaft was prepared as a seed crystal holding shaft, and the top face of the seed crystal substrate was bonded to roughly the center section of the end face of the cylindrical graphite shaft, using a graphite adhesive.

Using a single crystal production apparatus as shown in FIG. 3, Si, Cr, Al and B were loaded as a molten liquid material for formation of a Si—C solution, at an atomic composition percentage of Si:Cr:Al:B=53.98:35.99:10.00:0.03 (at %), into a graphite crucible holding a Si—C solution. That is, the solvent composition (Si/Cr/Al/B) of the Si—C solution was 53.98/35.99/10.00/0.03 (at %).

After vacuum suction of the interior of the single crystal production apparatus to $1 \times 10^{-3}$ Pa, argon gas was introduced to 1 atmosphere and the air inside the single crystal production apparatus was exchanged with argon. A high-frequency coil was electrified to melt the starting material in the graphite crucible by heating, thereby forming a molten liquid containing Si, Cr, Al and B. Then, a sufficient amount of C was dissolved into the molten liquid containing Si, Cr, Al and B from the graphite crucible to form a Si—C solution.

The outputs of the upper level coil and lower level coil were adjusted to heat the graphite crucible so that the temperature of the surface of the Si—C solution was increased to 2000° C., and a temperature gradient in which the temperature decreased from the solution interior in a range of 1 cm from the Si—C solution surface toward the solution surface, was 30° C./cm. Temperature measurement of the surface of the Si—C solution was performed with a radiation thermometer, and measurement of the temperature gradient of the Si—C solution was conducted by using a vertically movable thermocouple.

Seed touching was conducted, in which the position of the bottom face of the seed crystal substrate was placed at a position matching the liquid surface of the Si—C solution, and the bottom face of the seed crystal substrate was contacted with the Si—C solution, while keeping the bottom face of the seed crystal substrate bonded to the graphite shaft parallel to the Si—C solution surface. The graphite shaft was then raised 1.5 mm to prevent the Si—C solution from seeping upward and contacting the graphite shaft, and was held at that position for 10 hours to grow a crystal.

Figure 4:
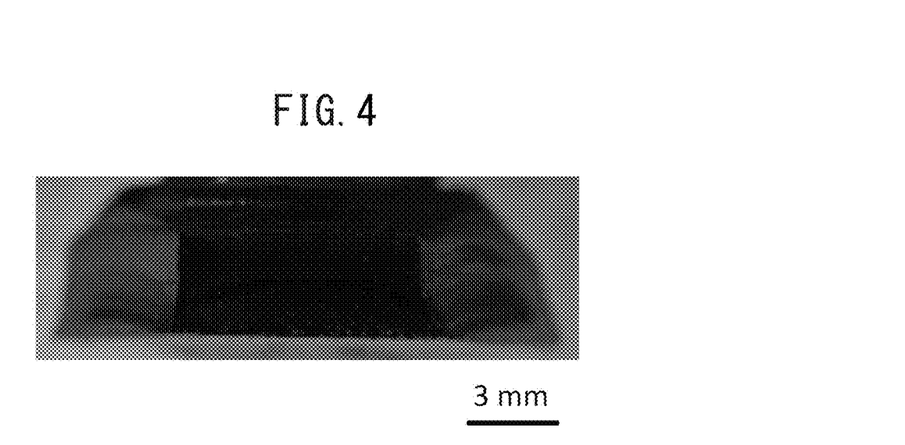
FIG. 4 is an external photograph of the grown crystal obtained in Example 1, as observed from the side.

Upon completion of the crystal growth, the graphite shaft was raised, and the seed crystal substrate and the SiC crystal grown from the seed crystal substrate were severed from the Si—C solution and the graphite shaft and were recovered. The obtained grown crystal had a diameter of 20 mm and a thickness of 4.5 mm. The diameter of the obtained grown crystal is the diameter of the growth surface. FIG. 4 shows an external photograph of the grown crystal observed from the side.

In order to measure the resistivity of the obtained grown crystal, the (0001) face of the grown crystal cut out to a thickness of 0.5 mm from the growth surface was mirror polished, worked to a 5 mm square and cleaned, after which a circular Ni ohmic electrode with a diameter of 1 mm was formed by vacuum vapor deposition on the four corners of the (0001) face. The electrode-attached grown crystal was used for Hall measurement by the Van der Pauw method at room temperature (25° C.), and measurement of the resistivity of the grown crystal resulted in resistivity of 13 mΩ·cm, indicating that a p-type SiC single crystal was obtained.

The obtained grown crystal was sliced parallel to the growth direction to cut out a 1 mm-thick grown crystal, as shown in FIG. 1A and FIG. 1B, and upon observation with an optical microscope with light directed from below, no inclusions were found.

The Al concentration in the grown crystal was measured by secondary ion mass spectrometry (SIMS, product of Cameca). The reference sample used was a sample comprising Al ion-implanted into a SiC substrate. The Al concentration of the grown crystal was $4.1 \times 10^{20}/cm^3$.

Example 2

Crystal growth was conducted under the same conditions as Example 1, except that the Si—C solution solvent composition (Si/Cr/Al/B) was 53.94/35.96/10.00/0.10 (at %), and the crystal growth was conducted for 5 hours.

Figure 5:
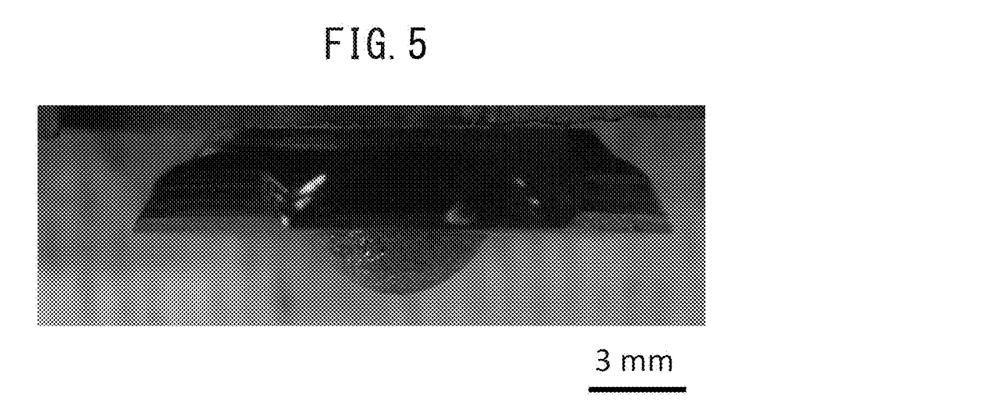
FIG. 5 is an external photograph of the grown crystal obtained in Example 2, as observed from the side.

The obtained grown crystal was a p-type SiC single crystal with a diameter of 20 mm, a thickness of 2.7 mm and resistivity of 9 mΩ·cm, and no inclusions were found. The Al concentration of the grown crystal was $7.1 \times 10^{20}/cm^3$. FIG. 5 shows an external photograph of the grown crystal observed from the side.

Example 3

Crystal growth was conducted under the same conditions as Example 1, except that the solvent composition (Si/Cr/Al/B) of the Si—C solution was 53.82/35.88/10.00/0.30 (at %).

The obtained grown crystal was a p-type SiC single crystal with a diameter of 20 mm and resistivity of 15 mΩ·cm, and no inclusions were found. The Al concentration of the grown crystal was $3.1 \times 10^{20}/cm^3$.

Example 4

Crystal growth was conducted under the same conditions as Example 1, except that the solvent composition (Si/Cr/Al/B) of the Si—C solution was 53.40/35.60/10.00/1.00 (at %).

The obtained grown crystal was a p-type SiC single crystal with a diameter of 20 mm and resistivity of 29 mΩ·cm, and no inclusions were found. The Al concentration of the grown crystal was $2.3 \times 10^{20}/cm^3$.

Example 5

Crystal growth was conducted under the same conditions as Example 1, except that the solvent composition (Si/Cr/Al/B) of the Si—C solution was 47.40/31.60/20.00/1.00 (at %).

The obtained grown crystal was a p-type SiC single crystal with a diameter of 20 mm and resistivity of 16 mΩ·cm, and no inclusions were found. The Al concentration of the grown crystal was $2.5 \times 10^{20}/cm^3$.

Example 6

Crystal growth was conducted under the same conditions as Example 1, except that the solvent composition (Si/Cr/Al/B) of the Si—C solution was 41.40/27.60/30.00/1.00 (at %).

The obtained grown crystal was a p-type SiC single crystal with a diameter of 20 mm and resistivity of 12 mΩ·cm, and no inclusions were found. The Al concentration of the grown crystal was $4.3 \times 10^{20}/cm^3$.

Comparative Example 1

Crystal growth was conducted under the same conditions as Example 1, except that the solvent composition (Si/Cr/Al/B) of the Si—C solution was 54.00/36.00/10.00/0.00 (at %).

The obtained grown crystal was a p-type SiC single crystal with a diameter of 20 mm and resistivity of 35 mΩ·cm, and no inclusions were found. The Al concentration of the grown crystal was $1.8 \times 10^{20}/cm^3$.

Comparative Example 2

Crystal growth was conducted under the same conditions as Example 1, except that the solvent composition (Si/Cr/Al/B) of the Si—C solution was 59.40/39.60/1.00/0.00 (at %).

The obtained grown crystal was a p-type SiC single crystal with a diameter of 20 mm and resistivity of 1219 mΩ·cm, and no inclusions were found. The Al concentration of the grown crystal was $3.5 \times 10^{19}/cm^3$.

Comparative Example 3

Crystal growth was conducted under the same conditions as Example 1, except that the solvent composition (Si/Cr/Al/B) of the Si—C solution was 58.20/38.80/3.00/0.00 (at %).

The obtained grown crystal was a p-type SiC single crystal with a diameter of 20 mm and resistivity of 120 mΩ·cm, and no inclusions were found. The Al concentration of the grown crystal was $6.3 \times 10^{19}/cm^3$.

Comparative Example 4

Crystal growth was conducted under the same conditions as Example 1, except that the solvent composition (Si/Cr/Al/B) of the Si—C solution was 48.00/32.00/20.00/0.00 (at %).

The obtained grown crystal was a p-type SiC single crystal with a diameter of 20 mm and resistivity of 35 mΩ·cm, and no inclusions were found. The Al concentration of the grown crystal was $1.8 \times 10^{20}/cm^3$.

Table 1 shows the solvent compositions of Examples 1 to 6 and Comparative Examples 1 to 4, and the Al concentrations and resistivities of the grown crystals obtained.

TABLE 1

|  | Si (at %) | Cr (at %) | Al (at %) | B (at %) | Al concentration ($cm^{-3}$) | Resistivity (mΩcm) |
|---|---|---|---|---|---|---|
| Example 1 | 53.98 | 35.99 | 10.00 | 0.03 | $4.1 \times 10^{20}$ | 13 |
| Example 2 | 53.94 | 35.96 | 10.00 | 0.10 | $7.1 \times 10^{20}$ | 9 |
| Example 3 | 53.82 | 35.88 | 10.00 | 0.30 | $3.1 \times 10^{20}$ | 15 |
| Example 4 | 53.40 | 35.60 | 10.00 | 1.00 | $2.3 \times 10^{20}$ | 29 |
| Example 5 | 47.40 | 31.60 | 20.00 | 1.00 | $2.5 \times 10^{20}$ | 16 |
| Example 6 | 41.40 | 27.60 | 30.00 | 1.00 | $4.3 \times 10^{20}$ | 12 |
| Comp. Example 1 | 54.00 | 36.00 | 10.00 | 0.00 | $1.8 \times 10^{20}$ | 35 |
| Comp. Example 2 | 59.40 | 39.60 | 1.00 | 0.00 | $3.5 \times 10^{19}$ | 1219 |
| Comp. Example 3 | 58.20 | 38.80 | 3.00 | 0.00 | $6.3 \times 10^{19}$ | 120 |
| Comp. Example 4 | 48.00 | 32.00 | 20.00 | 0.00 | $1.8 \times 10^{20}$ | 35 |

Figure 6:
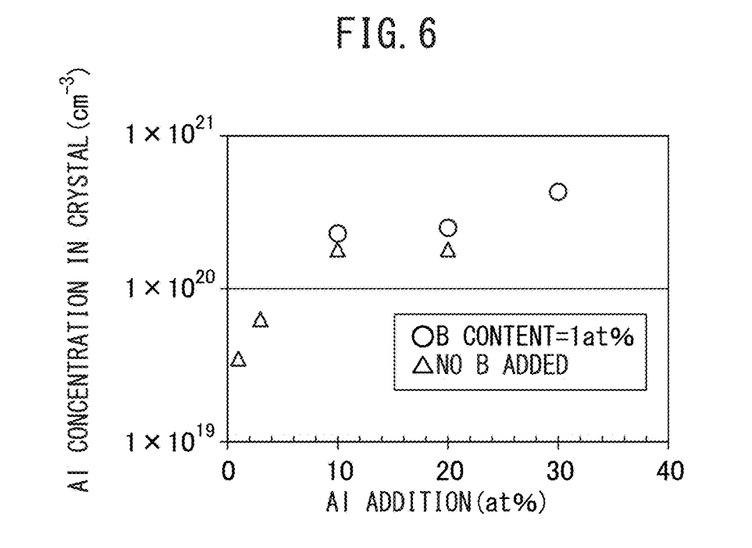
FIG. 6 is a graph representing the Al concentration of grown crystals upon varying the Al content of the Si—C solution, with a B content of 1.00 at % in the Si—C solution and with no addition of B to the Si—C solution.

FIG. 6 is a graph representing the Al concentrations of the grown crystals of Examples 4 to 6 with varying Al content, where the B content of the Si—C solution was 1 at %, and the Al concentrations of the grown crystals of Comparative Examples 1 to 4 with varying Al content, without addition of B to the Si—C solution. Even with increasing Al content, but without addition of B to the Si—C solution, the Al concentration in the grown crystal did not increase when the Al content of the Si—C solution was in the range of 10 at % or greater. However, when B is added to the Si—C solution, the Al concentration in the grown crystal can be increased by raising the Al content in a range of 10 at % or greater.

Figure 7:
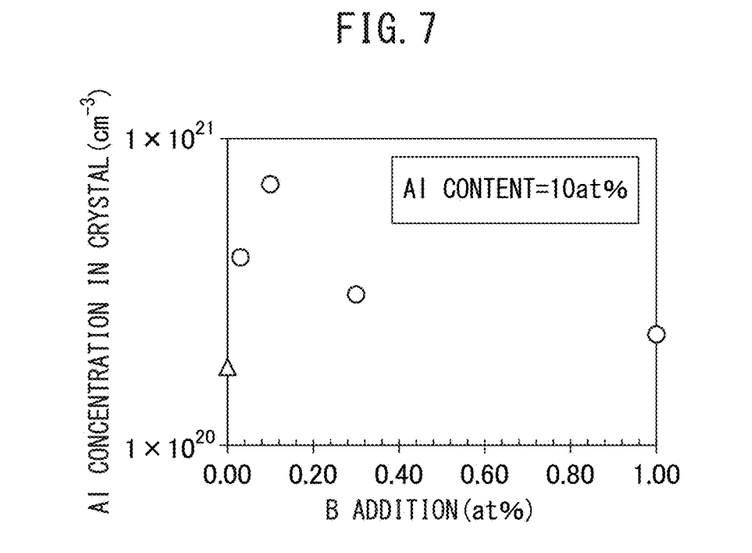
FIG. 7 is a graph representing the Al concentration of grown crystals upon varying the B content of the Si—C solution, with an Al content of 10 at % in the Si—C solution.

FIG. 7 is a graph representing the Al concentrations of grown crystals upon varying the B content of the Si—C solution, with an Al content of 10 at %. This demonstrates that it is possible to increase the Al concentration of a grown crystal compared to the prior art, by adding B to the Si—C solution even in a small amount.

EXPLANATION OF SYMBOLS

100 Single crystal production apparatus
10 Crucible
12 Seed crystal holding shaft
14 Seed crystal substrate
18 Heat-insulating material
22 High-frequency coil
22A Upper level high-frequency coil
22B Lower level high-frequency coil
24 Si—C solution
26 Quartz tube
34 Meniscus
40 SiC grown crystal
42 Cut out grown crystal

What is claimed is:

1. A method for producing a p-type SiC single crystal in which a SiC seed crystal substrate is contacted with a Si—C solution having a temperature gradient such that a temperature of the Si—C solution decreases from an interior of the Si—C solution toward a surface of the Si—C solution, to grow the p-type SiC single crystal,
   wherein the Si—C solution comprises Si, Cr, Al and B,
   the Al is comprised in the Si—C solution in an amount of 10 at % or greater, based on the total of the Si, Cr, Al and B,
   the B is comprised in the Si—C solution in an amount of greater than 0.00 at % and no greater than 1.00 at %, based on the total of the Si, Cr, Al and B, and
   the p-type SiC single crystal has a resistivity of 9 to 29 mΩ·cm.

2. The method for producing a p-type SiC single crystal according to claim 1, wherein the B is comprised in the Si—C solution in an amount of between 0.03 at % and 1.00 at %, inclusive, based on the total of the Si, Cr, Al and B.

3. The method for producing a p-type SiC single crystal according to claim 2, wherein the B is comprised in the Si—C solution in an amount of between 0.03 at % and 0.30 at %, inclusive, based on the total of the Si, Cr, Al and B.

4. The method for producing a p-type SiC single crystal according to claim 1, wherein the B is comprised in the Si—C solution in an amount of between 0.03 at % and 0.30 at %, inclusive, based on the total of the Si, Cr, Al and B.

5. The method for producing a p-type SiC single crystal according to claim 1, wherein the Al is comprised in the Si—C solution in an amount of 25 at % or greater, based on the total of the Si, Cr, Al and B.

6. The method for producing a p-type SiC single crystal according to claim 1, wherein the p-type SiC single crystal has a resistivity of 9 to 15 mΩ·cm.

7. The method for producing a p-type SiC single crystal according to claim 1, wherein the p-type SiC single crystal has a resistivity of 9 to 15 mΩ·cm, and
   the B is comprised in the Si—C solution in an amount of between 0.03 at % and 0.30 at %, inclusive, based on the total of the Si, Cr, Al and B.

* * * * *